United States Patent [19]

Schoernig

[11] Patent Number: 4,740,075
[45] Date of Patent: Apr. 26, 1988

[54] DEVICE FOR PROCESSING PHOTOSENSITIVE MATERIALS

[75] Inventor: Eberhard Schoernig, Taunusstein, Fed. Rep. of Germany

[73] Assignee: Hoechst Aktiengesellschaft, Frankfurt am Main, Fed. Rep. of Germany

[21] Appl. No.: 97,729

[22] Filed: Sep. 17, 1987

[30] Foreign Application Priority Data

Sep. 18, 1986 [DE] Fed. Rep. of Germany ....... 3631668

[51] Int. Cl.$^4$ .............................................. G03B 3/08
[52] U.S. Cl. .................... 354/320; 354/325; 15/77; 15/102; 118/419
[58] Field of Search ............... 354/317, 320, 321, 322, 354/324, 325; 15/77, 102; 118/110, 419

[56] References Cited

U.S. PATENT DOCUMENTS

| 4,091,404 | 5/1978 | Schoernig | 354/321 |
| 4,119,991 | 10/1978 | Martino | 354/320 |
| 4,148,576 | 4/1979 | Martino | 354/325 |
| 4,190,345 | 2/1980 | Taylor | 354/325 |
| 4,371,250 | 2/1983 | Wakabayashi et al. | 354/325 |
| 4,383,751 | 5/1983 | Schoernig | 354/322 |
| 4,464,035 | 7/1984 | Schoernig | 354/299 |

FOREIGN PATENT DOCUMENTS

G8200249 5/1982 Fed. Rep. of Germany .

Primary Examiner—A. A. Mathews
Attorney, Agent, or Firm—Schwartz, Jeffery, Schwaab, Mack, Blumenthal & Evans

[57] ABSTRACT

A compact device which can be attached to a conventional printing plate developing machine either as a correcting agent washing station or as a developing station is provided. The device comprises an antechamber and a brush area which contains a brush roller, squeeze rollers, spray tubes, a doctor blade resting against the upper squeeze roller and a sealing blade resting against the lower squeeze roller. The squeeze rollers and the sealing blade create a fluid bath which reaches into an antechamber and the fluid level of which is limited by overflows in the side shields of the device. The antechamber is separated from the brush area by a partition. The brush roller is partially immersed in the fluid bath. In the antechamber, a spray tube is located through which fluid is fed into the fluid bath without spraying the printing plate surface. Pairs of feed rollers, transport the printing plate along an inclined feed table. A closeable bottom drain is closed during operation of the device and is opened for replacing the fluid bath.

19 Claims, 3 Drawing Sheets

DEVICE FOR PROCESSING PHOTOSENSITIVE MATERIALS

BACKGROUND OF THE INVENTION

The invention relates to a device for processing photosensitive materials such as printing plates, comprising an obliquely downwardly inclined feed table, a first spray tube containing nozzles for spraying liquid onto the photosensitive material, a brush roller rotating in the opposite direction to the direction of passage of the material and a pair of squeeze rollers.

German Utility Model No. 82 00 249 discloses a device for removing correcting agent from printing plates. This known device is accommodated in a casing which also houses a developing station which is positioned before the device and a gumming station which is positioned following the device. The brush roller rotates in a direction opposite to the direction of passage of the printing plate behind the spray tube and forms a wedge-shaped pool of water below the spray tube, which dilutes the correcting agent located on the printing plates so that it no longer attacks the plate surface. The drops of the generally viscous correcting agent which adhere to the plate surface are mechanically removed by the brush roller and thrown into the pool of water. The correcting agent diluted in the pool of water flows off with the water over the side edges of the printing plate to be corrected so that, behind the brush roller, the printing plate has only a thin film of water which is then squeezed off by the following pair of squeeze rollers. The printing plate from which the correcting agent has been cleaned off can be regummed in the subsequent gumming station.

In European Patent Application No. 0,080,659, a processing apparatus for imagewise exposed photosensitive materials is described which has three treatment zones. In an upper section of the housing are two separate, obliquely downwardly inclined inlet tables which open into admission slots. A lower tank section is integrally constructed with the inlet tables and accommodates the tank inserts of the three treatment zones. The treatment fluid is applied to the top and underside of the material to be developed in each of the three treatment zones. In the treatment zones, the material is successively developed, rinsed or washed and, finally, preserved. The developed material is corrected outside the apparatus after which a further preserving and gumming step, respectively, then follows. For this last step, the corrected developed material is pushed via one inlet table directly into the treatment zone for preserving the developed material.

In European Pat. No. 0,050,818, a developing apparatus for sheet material, which is used, for example, for flexible printing plates, is described which consists of a two-tank combination with a separating web. The two tank combination has a developer tank and a post treatment tank and comprises removable inserts for transport and guide means having pairs of feed rollers and discharge rollers for guiding the material along an arcuate path through the treatment fluid baths. A rotating brushing roller with a spring loaded counter roller on the other side of the transport path is located in front of the discharge area of the developer tank above the transport path of the material and partially below the fluid level. The brushing roller is covered by a protective cap having one bottom edge which extends below the developer fluid level.

German Pat. No. 2,164,981 describes a developing device for electro-photographic recording material containing a pair of feed rollers and a pair of squeeze rollers between which the recording material is obliquely downwardly directed with the image side up. Between the pairs of rollers, a supply device for the liquid developer is disposed above the recording material for maintaining a developer bath above the recording material adjacent the pair of squeeze rollers. The supply device is shielded by a deflection part against the point of entry of the recording material into the developer bath, which bath is dammed by an obliquely downwardly extending support section for the sheet-shaped recording material, the side walls and the squeeze rollers.

Photosensitive material such as printing plates, photo papers and similar materials are frequently manually retouched with a correcting agent after development and gumming in a developing machine. The correcting agent dissolves part of the gumming and the developed layer of the photosensitive material and must be subsequently removed from the corrected developed material. During this removal process, care must be taken that the corrosive correcting agent does not attack and dissolve the remaining areas of the developed surface of the material. This removal step, which includes rinsing off the correcting agent, has been previously done by hand, although the device disclosed in the previously mentioned German Utility model document No. 82 00 249 enables the correcting agent to be rinsed off by machine. In this device, since the tufts of bristles of the brush roller which face away from the pool of water carry only a very small amount of water, the dilution, and, thus, the reliable removal, of the correcting agent from the plate surface is unsatisfactory. The device is designed merely for rinsing correcting agent from the printing plate surface and its application to another processing step such as the development or washing of a printing plate is not suggested.

SUMMARY OF THE INVENTION

One object of the invention is to provide an improved device having a very compact construction which is suitable either for reliably rinsing off correcting agents from the surface of a photosensitive material or for developing the surface of a photosensitive material with substantially gentle treatment of the surface of the material.

In accomplishing the foregoing objects, there has been provided according to the present invention a device for processing photosensitive materials, comprising a housing; an inclined feed table supported within the housing; means for feeding the photosensitive material along the inclined feed table; a receptacle for retaining fluid disposed within the housing and adjacent a lower end of the inclined feed table, the receptacle having an upper edge sealingly connected to the lower end of the inclined feed table; a pair of squeeze rollers rotatably supported by the housing and disposed adjacent the lower end of the inclined feed table, each roller being positioned on a respective side of the plane of a surface of the inclined feed table, whereby the pair of squeeze rollers squeeze the photosensitive material as it passes beyond the lower end of the inclined feed table; means for rotating each of the pair of squeeze rollers; a brush roller rotatably supported by the housing and positioned to brush the photosensitive material as it is fed along the surface of the inclined feed table, the brush roller being positioned upwardly from the pair of squeeze rollers with respect to the plane of the surface of the inclined feed table and having tufts of bristles along its circumferential surface; means for rotating the brush roller; means for preventing correcting agents and copying layer particles from adhering to the bristles of the brush roller, the means for preventing comprising a bath of fluid, the bath formed by positioning the pair of squeeze rollers with respect to the receptacle and the inclined feed table so that the fluid rises along the surface of the inclined feed table to immerse at least a portion of the brush roller, whereby the fluid sufficiently penetrates the bristles of the brush roller so as to prevent correcting agents and copying layer particles from adhering to the bristles; and means for feeding fluid to the bath without spraying the photosensitive material comprising a first spray tube supported by the housing above the bath and adapted to feed fluid directly into the bath.

In one preferred embodiment, the invention further comprises a device mounted on a developing machine for photosensitive materials to wash correcting agent off the photosensitive materials.

In another preferred embodiment, the invention further comprises a device attached to a developing machine for photosensitive materials and adapted to operate as a developing device.

Further objects, features and advantages of the present invention will become apparent from the detailed description of preferred embodiments that follow, when considered together with the attached figures of drawings.

BRIEF DESCRIPTION OF THE DRAWINGS

The invention is explained in greater detail with the aid of the drawings, in which.

DETAILED DESCRIPTION OF THE PREFERRED EMBODIMENTS

According to one embodiment of the invention, a pair of squeeze rollers are provided which dam the fluid bath to such a high level that the brush roller, which is disposed in front of the pair of squeeze rollers in the direction of passage of the material, is partially immersed in the fluid bath and the fluid bath is dammed into an antechamber in which a first spray tube, disposed above the fluid level, can feed fluid into the fluid bath without spraying off the surface of the material.

The compact construction of the self-contained device is of particular advantage since it enables the device to be attached to a corresponding printing plate developing machine, known per se, in order to extend the operation of the machine. For example, if the device is used as developing device, it can be mounted to a conventional negative printing plate developing machine in a simple manner, to use the developing machine as a positive printing plate developing machine. If the device according to the invention is used as a correcting agent washing device, it can also be mounted in a simple manner onto a conventional negative printing plate developing machine in order to expand the machine's operation.

Figure 1:
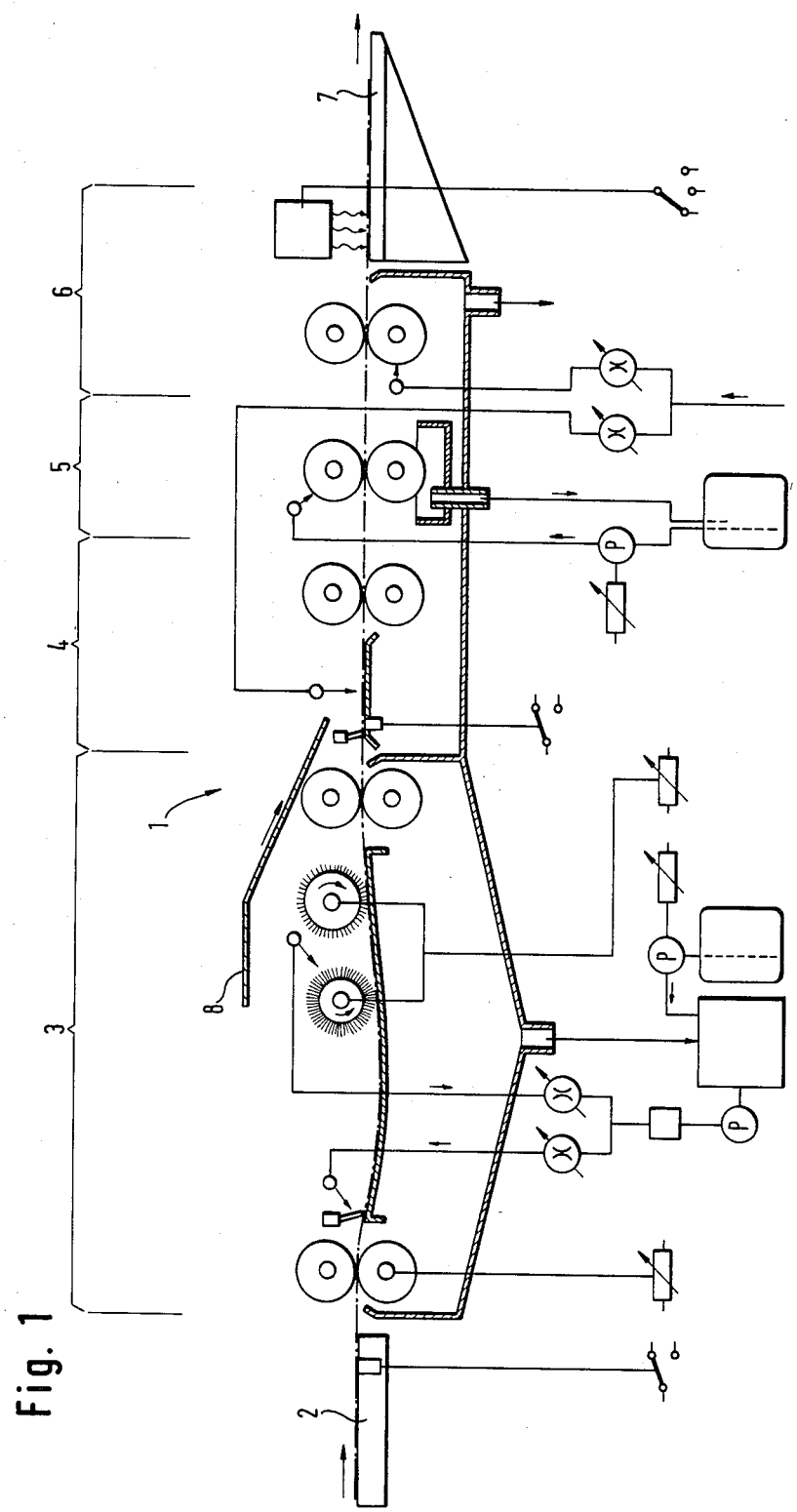
FIG. 1 is a diagram of a conventional printing plate developing machine.

The conventional printing plate developing machine 1 shown in FIG. 1 comprises a first feed table 2, a developing station 3, a rinsing station 4, a gumming station 5, a drying station 6, a discharge table 7 and a second feed table 8 for printing plates. The imagewise exposed printing plate to be processed is horizontally pushed into the printing plate developing machine 1 via the first feed table 2. The printing plate passes through the individual stations of the developing machine 1 along a path represented by the dot-dash line. As the printing plate is pushed into the developing machine 1, it is gripped by a pair of feed rollers in developing station 3 and transported along a guide plate. Developer fluid is applied via an application blade to the surface of the printing plate during which process the developer fluid is sprayed through a spray tube onto the application blade. In addition, developing station 3 contains a brush roller which rotates in the direction of passage of the printing plate and which is sprayed with developer fluid from a spray tube. This brush roller is followed by a roller with a plush cover having a spray tube (not shown) which roller rotates in a direction opposite to the direction of passage of the printing plate.

The two brush rollers uniformly distribute the developer fluid on the printing plate. A pair of squeeze rollers are located at the outlet of developing station 3 to squeeze the excessive developer fluid from the surface of the printing plate. The developer fluid which is removed by the squeezing is collected by a tank having a drain communicating with a storage tank for developer fluid. In rinsing station 4, which follows developing station 3, the surface of the developed printing plate is first squeegeed and subsequently rinsed with fresh water which is sprayed onto the surface of the printing plate from a rinsing tube. Rinsing station 4 also comprises a pair of squeeze rollers for squeezing excessive rinsing water from the surface of the printing plate.

In the gumming station 5, which follows rinsing station 4, the printing plate passes through a pair of rollers composed of an application roller for applying a preservation fluid for gumming the completely developed printing plate and an associated counter roller. The preservation fluid is applied to the application roller by means of a blade rail (not shown) which is sprayed with fluid by a spray tube. Drying station 6 comprises a pair of squeeze rollers and a heating facility above the path of the printing plate. The preservation fluid transferred from the upper squeeze roller to the lower squeeze roller is cleaned off the lower squeeze roller by applying water via a spray tube. The heating facility is located at the start of discharge table 7 and dries the developed printing plate by means of heat rays.

After the development of positive printing plates, manual corrections are generally necessary. The correcting agent used for this purpose is subsequently washed off after which an additional preservation of the corrected developed printing plate is required. To perform this additional preserving step, the positive printing plate developing machine 1 has a second feed table 8 via which the corrected printing plate, from which the correcting agent has been cleaned outside the machine, is obliquely fed into rinsing station 4. The rinsing is then followed by the further fixing step in gumming station 5.

Figure 2:
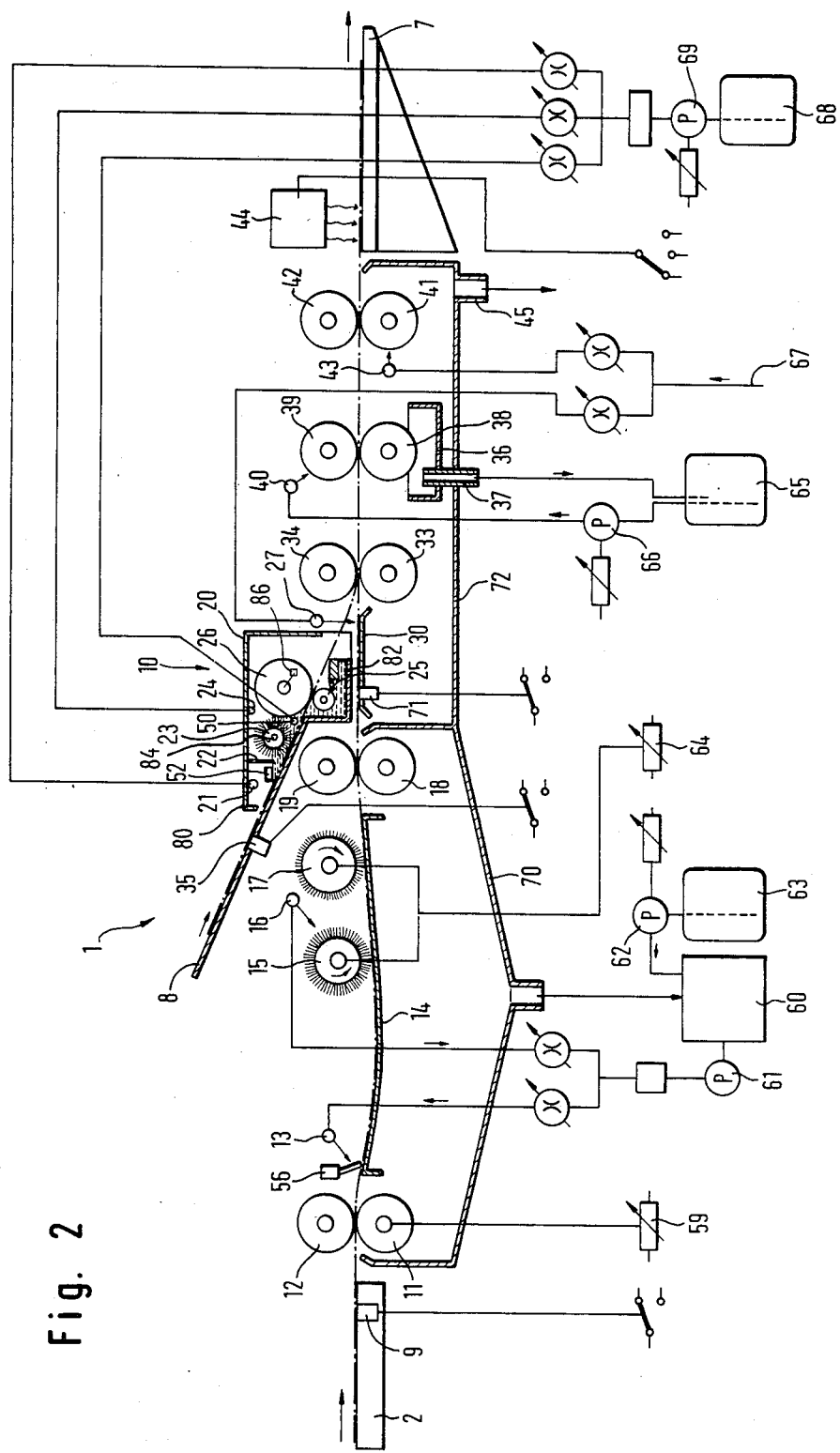
FIG. 2 is a diagram of a conventional printing plate developing machine, similar to FIG. 1, and supplemented with a device according to the invention.

In addition to the machine in FIG. 1, the printing plate developing machine 1 shown in FIG. 2 also comprises a device 10 according to the invention which is mounted above the second feed table 8. Device 10 is explained in greater detail with reference to FIG. 2 in the text which follows.

Device 10 comprises a housing 80 having a receptacle 82. Within housing 80, the passage of the printing plate is as follows.

The front edge of the entering printing plate is detected by a sensor 9 on feed table 2. The printing plate is transported by the pair of transport rollers 11, 12 onto a guide plate 14 of the developing station 3. In the direction of passage of the printing plate, a squeegee 56 is located close to the front edge of guide plate 14 and is wetted with developer fluid via a spray tube 13. The spray tube 13 is supplied with developer by a pump 61 from a container 60, as is a spray tube 16, which is a component of the supply line system and which is arranged obliquely above a brush roller 15 to uniformly distribute the sprayed-on developer over the printing plate as it passes through along the guide path below brush roller 15.

The speed of rotation of the driven lower transport roller 11 is controlled by a motor drive 59. The upper transport roller 12 is not driven.

As viewed in the direction of plate passage, the brush roller 15 is followed by a distributor roller 17 with a spray tube (not shown) which has a plush surface for finely distributing the applied developer over the plate surface. The distributor roller 17 can also have a very fine brush surface instead of a plush surface. The two rollers 15 and 17 are synchronously rotated by a common drive 64 which adjusts the speed of rotation. The excessive developer on the plate surface is squeezed off by the pair of squeeze rollers 18, 19 at the outlet of developing station 3 and flows into a collecting tank 70 which closes off the developing station 3 towards the bottom. This collecting tank 70 drains into container 60. When the developer concentration drops in container 60, the developer concentrate is replenished by a pump 62 connected with a storage container 63.

After leaving the developing station 3, the front edge of the printing plate is detected by a sensor 71, the signals of which trigger spray tubes 27 and 43 to spray with rinsing water. Within rinsing station 4, the printing plate passes over a guide plate 30 to a pair of squeeze rollers 33, 34. As viewed in the direction of passage of the printing plate, spray tube 27 is arranged in front of the pair of squeeze rollers 33, 34. Spray tube 27, like spray tube 43, is supplied with water via a common connection line 67. The rinsing water which is sprayed from spray tube 27 onto the surface of the passing printing plate, like the rinsing water squeezed from the plate surface by squeeze rollers 33, 34, flows into a collecting tank 72 which extends below rinsing station 4 and gumming station 5. This collecting tank 72 is equipped with a drainpipe 45.

After passing through squeeze rollers 33, 34, the printing plate reaches the gumming station 5 which comprises a pair of rollers 38, 39, and a tank 36 located under the rollers which has a drain pipe 37 leading into a storage container 65. Storage container 65 contains the preservation agent used for gumming the completely developed and rinsed printing plate. The upper roller 39 is an application roller having a squeegee (not shown) for the preserving agent whereas the lower roller 38 is a counter roller for the application roller.

The preserving agent is conveyed by a driven pump 66 to a spray tube 40 above application roller 39, from which tube the preserving agent passes the surface of application roller 39. Drainpipe 37 projects beyond the bottom of collecting tank 72. After leaving the gumming station 5, the printing plate passes into drying station 6 which comprises a dryer 44 and squeeze rollers 41 and 42 which are operated before the dryer operates to remove the excessive gumming. The lower squeeze roller 41 is cleaned with rinsing water from spray tube 43.

Dryer 44 is a heat radiation source having fans which contain infrared radiators whose radiation power can be regulated in steps. The dried printing plate leaves the printing plate developing machine 1 via discharge table 7 and can be subsequently corrected by hand by applying a correcting agent which dissolves defects on the positive printing plates. A printing plate corrected in this manner can then be fed through machine 1 via the second feed table 8, which extends obliquely with respect to the path of passage of the printing plate. In FIG. 2, device 10 is used as a correcting agent washing station. A covering hood 20 completely encloses device 10 except for a feed opening 48 and a discharge opening 49 for the printing plate.

In feed table 8 is a sensor 35 which during plate feeding raises a gate (not shown) which is lowered below the plane of passage. The front edge of the printing plate contacts and aligns itself against the lowered gate. The gate prevents the printing plate from being fed either too rapidly and with non-aligned edges; these are conditions which could undesirably shorten the acting time of the fluid on the printing plate in an antechamber 47 of device 10. The gate motion is synchronized with the speed of passage of the printing plate. After the rear edge of the printing plate has passed sensor 35, the gate is raised again prior to the arrival of a subsequent printing plate.

If the device 10, as shown in FIG. 2, is used as a correcting agent washing station, spray tubes 21, 24 and 50 within the device 10 are connected via a common line to either a water supply or to connecting line 67.

Figure 3:
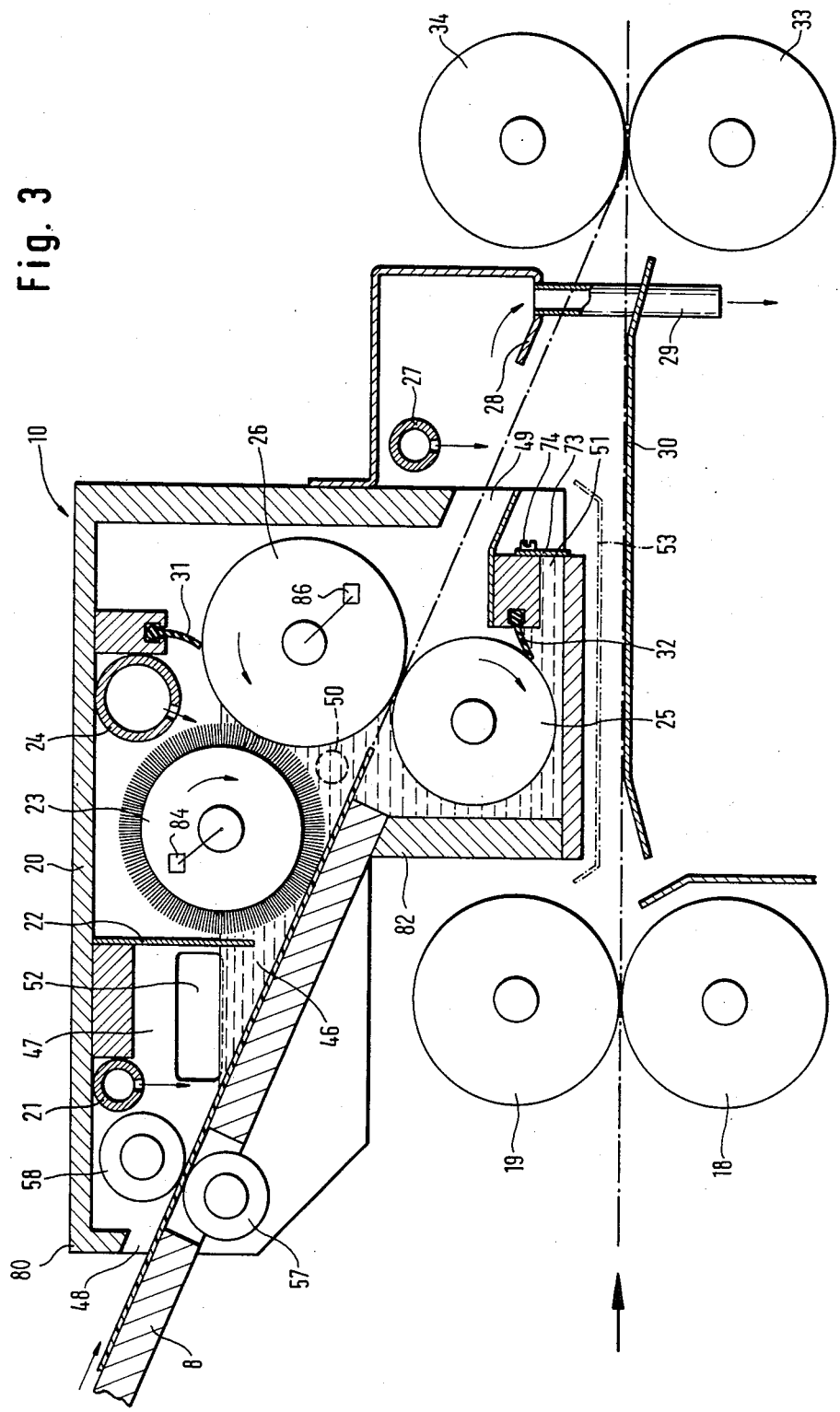
FIG. 3 is a sectional view of a device according to the invention.

The feed rollers 57, 58 shown in FIG. 3 are not required for the correcting agent washing station. They are only needed when the device is used as a developer station.

If the device 10 is used as a developing station, the spray tubes 21, 24 and 50 are supplied, via a pump 69, with liquid developer from a developer storage container 68, as can be seen from FIG. 2 in which the supply lines, pumps, storage containers and related components are schematically shown.

Device 10 will now be described in greater detail with the aid of FIG. 3. The expression "fluid" is understood to mean a cleaning fluid such as water or water with an additive when the device 10 is used as a correcting agent washing station, and to mean a liquid developer when device 10 is used as a developing station. Device 10 essentially comprises an antechamber 47 which is separated from the brush area by a partition 22. In the antechamber 47 are a pair of feed rollers 57, 58, if the device is used as a developing station, which grip and advance the printing plate which is pushed in via the second inclined feed table 8. The guide path of the printing plate is spring supported in the area of brush roller 23 and adjustable to adapt to differing printing plate thickness. Brush roller 23 is reversably rotated by a first rotation means 84.

The first spray tube 21 is used for feeding fluid into the presoaking zone of a fluid bath 46 which is dammed by squeeze rollers 25, 26 and sealing blade 32 in the brush area of device 10 to a level such that the fluid bath reaches into antechamber 47 to form the presoaking zone and such that the brush roller 23 in front of squeeze rollers 25, 26 is partially immersed in the fluid bath. Squeeze rollers 25, 26 are rotated by a second rotation means 86. The damming of fluid bath 46 and the squeeze removal of the excessive fluid from the plate surface are carried out by the pair of squeeze rollers 25, 26 in conjunction with sealing blade 32. To this end, rollers 25, 26 are positioned in a front-side sealing manner against the side shields of device 10. Covering hood 20 closes off antechamber 47, brush roller 23 and squeeze rollers 25 and 26 while leaving open only the feed and discharge opening 48 and 49 for the printing plate. In the dammed fluid bath 46 in antechamber 47, the printing plate is pretreated through an intensive presoaking and, in the brush area, the printing plate is intensively brushed by brush roller 23 underneath the fluid surface in a manner which is not harmful to the copying layer. It is essential that the bristles of the brush roller 23 be completely penetrated by fluid so that correcting agents, which may for example, be excessively applied to the printing plate, or the copying layer to be detached when device 10 is used as a developing station, cannot adhere to the bristles. Due to the partial immersion of brush roller 23 in fluid bath 46 and a cover plate (not shown) above brush roller 23, which prevents any scooping of air by brush roller 23, foaming is prevented. Foaming can also be prevented by special additives to the fluid.

The fluid level of fluid bath 46 is controlled by one or two adjustable overflows 52 in the side shields of the device.

The tufts of bristles of brush roller 23 are helically disposed, for example, from the center of the roller towards the front faces of the roller, to ensure that the detached particles are reliably transported away in the direction of the overflows. Instead of a brush roller, a roller with a plush cover can also be used.

In the brush area of device 10, the second spray tube 24 for supplying the main fluid volume is disposed above the upper squeeze roller 26 and close to brush roller 23. The fluid emerging from the second spray tube 24 sufficiently fills the spaces between the tufts of bristles, even at maximum speed of rotation of brush roller 23, so that the brush cover is completely penetrated by fluid. The two spray tubes 21 and 24 can be supplied, for example, with fluid pumped in a circuit, in which case, the third spray tube 50 is located in the fluid bath 46 between brush roller 23 and the upper squeeze roller 26, immediately above the plane of passage of the printing plate and is supplied with fresh fluid, for example, water from the mains network, for continued water replenishment when using the device 10 as a correcting agent washing station or with developer concentrate when using device 10 as a developing station.

Brush roller 23 is already rotating before coming into contact with the front edge of the printing plate in the direction of passage. After the front edge of the printing plate has passed through the point of contact with brush roller 23, its direction of rotation is reversed.

A squeegee 31 or other spray protection is located in the area of the crown at the upper squeeze roller 26, which ensures that dripping or splashing fluid runs into the dammed fluid bath 46 and does not reach the previously squeezed printing plate passing through via the crown of squeeze roller 26.

Adjustable and level-limiting overflows 52 which are laterally disposed in the area of the presoaking zone in the side shields, and the main fluid volume introduced by the second spray tube 24, produce a counter flow of the fluid with respect to the entering printing plate, which ensures that the fluid flow is always clean, i.e., screened, filtered or fresh fluid, when it reaches the printing plate through the pair of squeeze rollers 25, 26 in the area of the squeezing.

At the lowest point of fluid bath 46, a closeable bottom drain 51 is laterally disposed which is closed during the processing operation and which is opened for replacing the fluid bath. The bottom drain 51 is closed by a disc 73 which is screwed against the housing wall of device 10 by means of a screw 74. By pivoting around screw 74, it is possible to leave bottom drain 51 slightly open during operation of device 10 as a correcting agent washing station whereby fluid bath 46 can completely drain even after the printing plate developing machine 1 or device 10 has been switched off. When device 10 is then switched on again, a fresh fluid bath 46 must be dammed from the storage container or the circulating fluid volume must be replenished by fresh fluid if the fluid bath 46 has not yet completely drained. When the device 10 is used as a correcting agent washing station, it is preferable, in one embodiment, to fill the fluid bath only with fresh water since harmful correcting agent residues which are washed off the printing plate should not be carried into circulation.

In the discharge area for the printing plate is a fourth spray tube 27 located above the inclined path of printing plate passage. Close to discharge opening 49 of the printing plate, a scoop trough 28 is disposed which opens into a drain pipe 29. The rinsing water sprayed from the fourth spray tube 27 onto the printing plate surface bounces off the plate, is collected by the scooping trough 28, and is introduced via drainpipe 29 into the circuit of interconnected spray tubes 21, 24 and 50. The fourth spray tube 27 is identical to the spray tube which is commonly used in rinsing station 4 of a conventional printing plate developing machine 1, such as shown in FIG. 1. Spray tube 27 is used for the controlled rinsing of the printing plate surface both during normal horizontal passage between rollers 18, 19 and rollers 33, 34, and when device 10 is used as a correcting agent washing station or as a developing station.

As previously mentioned, due to its position below the spray tube and the inclination of the downwardly moving printing plate, the scooping trough 28 in the immediate vicinity of spray tube 27 collects the greatest proportion of the used, relatively clean rinsing water during the passage of the plate. During the correcting agent washing mode of operation, this rinsing water can be fed into the circuit for supplying the three spray tubes 21, 24 and 50 when the correcting agent is washed off with water.

A removable dripping plate 53 is located below the device 10, which plate is provided with a link (not shown) to the drain of developing machine 1. Dripping plate 53 is positioned between the lowest point of device 10 and the horizontal plane of passage of the printing plate through printing plate developing machine 1 in order to prevent the developer used in device 10 from dripping and spraying onto the printing plate.

When device 10 is used as a developer station, it is possible to adapt a normal negative printing plate developing machine 1 in a simple manner to handle positive printing plates. The fluid in the device 10 is then a positive developer for printing plates.

When device 10 is used as a correcting agent washing station, feed rollers 57, 58 are omitted and dripping plate 53 can then be removed from the developing machine.

What is claimed is:

1. A device for processing photosensitive materials, comprising:
    a housing;
    an inclined feed table supported within the housing;
    means for feeding the photosensitive material along the inclined feed table;
    a receptacle for retaining fluid disposed within the housing and adjacent a lower end of the inclined feed table, the receptacle having an upper edge sealingly connected to the lower end of the inclined feed table;
    a pair of squeeze rollers rotatably supported by the housing and disposed adjacent the lower end of the inclined feed table, each roller being positioned on a respective side of the plane of a surface of the inclined feed table, whereby the pair of squeeze rollers squeeze the photosensitive material as it passes beyond the lower end of the inclined feed table;
    means for rotating each of the pair of squeeze rollers;
    a brush roller rotatably supported by the housing and positioned to brush the photosensitive material as it is fed along the surface of the inclined feed table, the brush roller being positioned upwardly from the pair of squeeze rollers with respect to the plane of the surface of the inclined feed table and having tufts of bristles along its circumferential surface;
    means for rotating the brush roller;
    means for preventing correcting agents and copying layer particles from adhering to the bristles of the brush roller, the means for preventing comprising a bath of fluid, the bath formed by positioning the pair of squeeze rollers with respect to the receptacle and the inclined feed table so that the fluid rises along the surface of the inclined feed table to immerse at least a portion of the brush roller, whereby the fluid sufficiently penetrates the bristles of the brush roller so as to prevent correcting agents and copying layer particles from adhering to the bristles; and
    means for feeding fluid to the bath without spraying the photosensitive material comprising a first spray tube supported by the housing above the bath and adapted to feed fluid directly into the bath.

2. A device as claimed in claim 1 further comprising a sealing blade positioned against one of the pair of squeeze rollers.

3. A device as claimed in claim 1 wherein the axial ends of the brush roller and the squeeze rollers sealingly contact the sides of the housing.

4. A device as claimed in claim 1 further comprising a covering hood having a feed opening and discharge opening.

5. A device as claimed in claim 4 wherein a partition projects downward from the cover into the bath at a position between the brush roller and the surface of the inclined feed table.

6. A device as claimed in claim 1 further comprising a second spray tube for supplying fluid to the brush roller and adapted to rotate in a direction opposite to the direction of passage of the photosensitive material, the second spray tube being disposed above the uppermost of the pair of squeeze rollers such that fluid which is sprayed by the tube fills the spaces between the bristles of the brush roller.

7. A device as claimed in claim 6 further comprising a third spray tube which supplies fresh fluid to the bath, the third spray tube being located directly above the inclined feed table and positioned between the brush roller and the uppermost of the pair of squeeze rollers.

8. A device as claimed in claim 6 wherein the first and second spray tubes are connected to one another and are supplied with fluid pumped in a circuit.

9. A device as claimed in claim 3 wherein a squeegee is positioned against the uppermost of the pair of squeeze rollers.

10. A device as claimed in claim 1 further comprising a closeable bottom drain which is closed during passage of the photosensitive materials through the device and which is opened during replenishment of the bath.

11. A device as claimed in claim 1 further comprising a fourth spray tube located downwardly from the pair of squeeze rollers with respect to the plane of the surface of the incline feed table, a scoop trough and a drain pipe.

12. A device as claimed in claim 6 further comprising a pair of adjustable overflows, each of the pair of adjustable overflows being positioned on oppositely facing sides of the housing.

13. A developing machine for photosensitive materials, including means for washing correcting agent off the photosensitive materials, wherein said washing means comprises a device as claimed in claim 1, wherein the fluid is water for washing the correcting agent from the material.

14. A developing machine for photosensitive materials comprising a device as claimed in claim 1 adapted to operate as a developing device, the device further comprising a pair of feed rollers, and the fluid is a developer for developing the photosensitive material.

15. A device as claimed in claim 14 further comprising a removable dripping plate positioned below said developing device.

16. A device as claimed in claim 14 comprising means for rotating the brush roller in the direction of passage of the photosensitive material until the leading edge of the material has contacted the brush roller, and means for rotating the brush roller in the reverse direction after said contact.

17. A device as claimed in claim 1 including means for adjusting the speed of rotation of the brush roller.

18. A device as claimed in claim 1 further comprising a guidance path for guiding the photosensitive material, the guidance path being spring supported and adjustable in the area of the brush roller.

19. A device as claimed in claim 1 wherein the tufts of the bristles of the brush roller are helically arranged.

* * * * *